(12) United States Patent
Oh et al.

(10) Patent No.: US 8,205,131 B2
(45) Date of Patent: Jun. 19, 2012

(54) METHOD FOR PRODUCING PARITY CHECK MATRIX FOR LOW COMPLEXITY AND HIGH SPEED DECODING, AND APPARATUS AND METHOD FOR CODING LOW DENSITY PARITY CHECK CODE USING THE SAME

(75) Inventors: Jong-Ee Oh, Daejon (KR); Chanho Yoon, Daejon (KR); Minho Cheong, Daejon (KR); Sok-Kyu Lee, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 1084 days.

(21) Appl. No.: 12/113,638

(22) Filed: May 1, 2008

(65) Prior Publication Data

US 2009/0158112 A1 Jun. 18, 2009

(30) Foreign Application Priority Data

Dec. 18, 2007 (KR) .................. 10-2007-0133279

(51) Int. Cl.
*H03M 13/00* (2006.01)
*G06F 11/00* (2006.01)
(52) U.S. Cl. .................. 714/752; 714/801
(58) Field of Classification Search .................. 714/800, 714/801, 755, 738, 758, 752, 804
See application file for complete search history.

(56) References Cited

U.S. PATENT DOCUMENTS 7,313,752 B2* 12/2007 Kyung et al. ............ 714/801
7,783,952 B2* 8/2010 Nimbalker et al. ...... 714/755
2006/0190801 A1* 8/2006 Shin et al. ............ 714/758
2008/0222486 A1* 9/2008 Richardson et al. ...... 714/757
2010/0031116 A1* 2/2010 Yoon et al. ............ 714/752

FOREIGN PATENT DOCUMENTS

| KR | 10-2005-0021108 A | 3/2005 |
|---|---|---|
| KR | 1020060058792 A | 6/2006 |
| KR | 10-2007-0035283 A | 3/2007 |
| KR | 10-2007-0042105 A | 4/2007 |

OTHER PUBLICATIONS

R.G. Gallager, "Low-Density Parity-Check Codes", IRE Transactions on Information Theory, Jan. 1962, pp. 21-28.
Marc P.C. Fossorier, "Quasi-Cyclic Low-Density Parity-Check Codes From Circulant Permutation Matrices", IEEE Transactions on Information Theory, vol. 50, No. 8, Aug. 2004, pp. 1788-1793.
Brian Classon et al., "Modified LDPC Matrix providing improved performance", IEEE 802.16 Broadband Wireless Access Working Group submission dated May 15, 2004.
Thomas J. Richardson et al., "Efficient Encoding of Low-Density Parity-Check Codes", IEEE Transactions on Information Theory, vol. 47, No. 2, Feb. 2001, pp. 638-656.

* cited by examiner

*Primary Examiner* — Phung M Chung
(74) *Attorney, Agent, or Firm* — Kile Park Goekjian Reed & McManus PLLC

(57) ABSTRACT

Provided are a method for producing a parity check matrix for low complexity and high speed decoding, and an apparatus and method for coding a Low Density Parity Check (LDPC) code using the same. The method includes: calculating a cyclic shift value of a subblock to a matrix; and when the calculated cyclic shift values of the subblock are arrayed in the matrix, producing a parity check matrix by arraying the cyclic shift values of the subblock except '0 matrix' without duplication to any one column.

15 Claims, 4 Drawing Sheets

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | – | 19 | – | 26 | – | 5 | – | – | 4 | – | – | – | 0 | 0 | – | – | – | – | – | – | – | – | – | – |
| 1 | 30 | – | 5 | – | – | – | 0 | – | – | 30 | – | – | – | 1 | 1 | – | – | – | – | – | – | – | – | – |
| 2 | 23 | 2 | – | – | – | 0 | – | – | – | – | – | 15 | – | – | 2 | 2 | – | – | – | – | – | – | – | – |
| 3 | – | – | 14 | 15 | – | – | 5 | – | – | 12 | – | – | – | – | – | 3 | 3 | – | – | – | – | – | – | – |
| 4 | 0 | – | 19 | – | 12 | – | – | – | – | – | 29 | – | – | – | – | – | 4 | 4 | – | – | – | – | – | – |
| 5 | – | 17 | – | 18 | – | – | – | 36 | – | – | – | 1 | – | – | – | – | – | 5 | 5 | – | – | – | – | – |
| 6 | – | 5 | 20 | – | – | – | 17 | – | 11 | – | – | – | – | – | – | – | – | – | 6 | 6 | – | – | – | – |
| 7 | 31 | – | – | 31 | 30 | – | – | – | – | 5 | – | – | – | – | – | – | – | – | – | 7 | 7 | – | – | – |
| 8 | 14 | – | – | 16 | – | 3 | – | – | – | – | 35 | – | – | – | – | – | – | – | – | – | 8 | 8 | – | – |
| 9 | 32 | 34 | – | – | – | – | 30 | – | – | – | – | 6 | – | – | – | – | – | – | – | – | – | 9 | 9 | – |
| 10 | – | – | 30 | 25 | – | – | – | – | 31 | 11 | – | – | – | – | – | – | – | – | – | – | – | – | 10 | 10 |
| 11 | – | 35 | 17 | – | 9 | – | – | 1 | – | – | – | – | – | – | – | – | – | – | – | – | – | – | – | 11 |

METHOD FOR PRODUCING PARITY CHECK MATRIX FOR LOW COMPLEXITY AND HIGH SPEED DECODING, AND APPARATUS AND METHOD FOR CODING LOW DENSITY PARITY CHECK CODE USING THE SAME

CROSS-REFERENCE(S) TO RELATED APPLICATIONS

The present invention claims priority of Korean Patent Application No. 10-2007-0133279, filed on Dec. 18, 2007, which is incorporated herein by reference.

BACKGROUND OF THE INVENTION

1. Field of the Invention

The present invention relates to a method for producing a parity check matrix for low complexity and high speed decoding, and an apparatus and method for coding a Low Density Parity Check (LDPC) code using the same; and, more particularly, to a parity check matrix producing method that can reduce complexity and decode a parity check code at high-speed by producing a parity check matrix by arraying shift values of a subblock of the parity check matrix without duplication, and producing a parity bit by classifying a linear equation on the produced parity check matrix as an independent linear equation, and an apparatus and method for coding an LDPC code using the same.

This work was supported by the IT R&D program for MIC/IITA [2006-S-002-02, "IMT-Advanced Radio Transmission Technology with Low Mobility"].

2. Description of Related Art

There are some cases that a signal transmitted in a digital format is not demodulated in a receiving part according to a state of a channel in a wired/wireless communication system. Diverse techniques are applied to the wired/wireless communication system to reduce error generation rate increasing due to high-speed communication. A channel coding technique is a representative error preventing technique which is applied to the wired/wireless communication system.

Recently, the channel coding technique is applied to most wireless communication systems. In particular, Low Density Parity Check (LDPC) codes are recognized as a next generation channel codec in the wireless communication system.

To have a look at the LDPC codes, it is assumed that the LDPC code is coded according to a systematic method. That is, a part of packet data of the LDPC code is outputted in the same format as inputted bit. A rest part of the packet data has a format that additional information corresponding to the parity bit, which is a code check bit, is consecutively added and outputted. Therefore, when the input bit is completely inputted in a block for coding, coding is performed. Also, a rate of the parity bit in the entire packet data is different according to the code rate. Also, the code rate is fixed by an H matrix, which is the parity check matrix.

The LDPC code is introduced by "Gallager". The LDPC code is defined as a parity check matrix where the minimum number of elements has a value '1' and most elements has a value '0'. The LDPC code is divided into a regular LDPC code and an irregular LDPC code. The regular LDPC code is an LDPC code suggested by "Gallager" where all rows in the parity check matrix have the same number of values '1' as an element and all columns have the same number of values '1' as an element. Differently from this, in the parity check matrix of the irregular LDPC code, there are rows including different numbers of values '1' or columns including different numbers of values '1'. It is known that the irregular LDPC code is superior to the regular LDPC code in an error correcting function.

"Fossorier" suggests a Quasi-cyclic LDPC code showing the element of the parity check matrix as a cyclic shifted identity matrix and '0 matrix', not as the elements '0' and '1' on matrix.

A conventional coding technology includes an efficient coding method of the LDPC suggested by "Richardson". In this coding method, the H matrix is divided into 6 subblocks and produces an output parity bit when an input vector is given as a simultaneous equation of the matrix. The subblocks include a simple operation.

A coder of a more simple coding method suggested by Motorola Inc. is reflected on the standard report of "802.16e". The LDPC coder suggest by Motorola Inc. is not operated using a matrix as a method suggested by "Richardson" but directly acquires a parity bit through a simultaneous equation.

The conventional LDPC code coding technology divides the parity check matrix into blocks and produces a parity check bit through a related matrix equation. Otherwise, the conventional LDPC code coding technology calculates all input values corresponding to the parity check matrix and acquires an output of the parity check bit produced after a coding procedure through an exact matrix and simultaneous equation. The conventional LDPC code coding technology has a problem that complexity increases according to increase of the subblock size in realization as hardware and it is difficult to solve the simultaneous equation on the parity bit.

In the conventional LDPC code coding technology, when the parity check matrix is applied to an LDPC decoding technology for decoding the produced coder, complexity increases according to increase of the subblock size and a decoding speed decreases since it is not proper to a parallel process.

SUMMARY OF THE INVENTION

An embodiment of the present invention is to solve the problem of the conventional technology that complexity increases according to increase of the subblock size and a decoding speed decreases since it is not proper to a parallel process.

Another embodiment of the present invention is directed to providing a parity check matrix producing method that can reduce complexity and decode a parity check code at high-speed by producing a parity check matrix by arraying shift values of a subblock of the parity check matrix without duplication, and producing a parity bit by classifying a linear equation on the produced parity check matrix as an independent linear equation, and an apparatus and method for coding a Low Density Parity Check (LDPC) code using the same.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

A parity check matrix is produced by arraying shift values of a subblock of the parity check matrix without duplication, and producing a parity bit by classifying a linear equation on the produced parity check matrix as an independent linear equation.

In accordance with an aspect of the present invention, there is provided a method for producing a parity check matrix, including: calculating a cyclic shift value of a subblock to a matrix; and when the calculated cyclic shift values of the subblock are arrayed in the matrix, producing a parity check matrix by arraying the cyclic shift values of the subblock except '0 matrix' without duplication to any one column.

In accordance with another aspect of the present invention, there is provided an apparatus for coding a LDPC code for low complexity and high-speed decoding, including: a bit input unit for receiving an input bit; an information vector producing unit for producing an information vector by multiplying the received input bit by an information block of a parity check matrix for high-speed decoding; a parity bit producing unit for producing a parity bit by separating the produced information vector and a linear equation on a parity block of the parity check matrix as an independent linear equation; and a bit output unit for outputting a code word by combining the received input bit and the produced parity bit.

In accordance with another aspect of the present invention, there is provided a method for coding LDPC code for low complexity and high-speed decoding, including: receiving an input bit; producing an information vector by multiplying the received input bit by an information block of a parity check matrix for high-speed decoding; producing a parity bit by separating the produced information vector and a linear equation on a parity block of the parity check matrix as an independent linear equation; and outputting a code word by combining the received input bit and the produced parity bit.

DESCRIPTION OF SPECIFIC EMBODIMENTS

The advantages, features and aspects of the invention will become apparent from the following description of the embodiments with reference to the accompanying drawings, which is set forth hereinafter. Therefore, those skilled in the field of this art of the present invention can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

A Low Density Parity Check (LDPC) codes are coded through an H matrix, which is a parity check matrix, and packet data coded through the H matrix is decoded through the H matrix in a decoding apparatus. The present invention relates to an apparatus for coding the LDPC code. Since an apparatus for decoding the LDPC code is not included in the present invention, it will not be described herein.

Figures 1, 2:
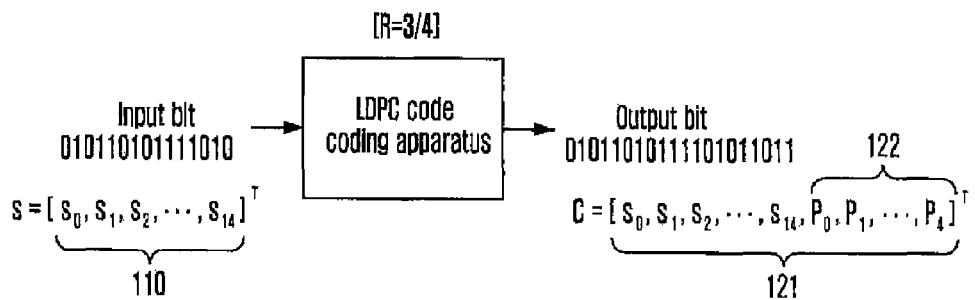
FIG. 1 shows a Low Density Parity Check (LDPC) code coding apparatus according to a code rate.
FIG. 2 shows a parity check matrix of an irregular QC-LDPC code in accordance with an embodiment of the present invention.

FIG. 1 shows an LDPC code coding apparatus according to a code rate.

Referring to FIG. 1, the LDPC code coding apparatus receives an input bit(s) 110, performs LDPC code coding according to a code rate R of a systematic LDPC code coding method, and outputs an output bit(c) 121. With respect to the input bit(s) 110, which is a 15-bit binary vector such as $[s_0, s_1, s_2, \ldots, s_{14}]^T$ the LDPC code coding apparatus acquires a 5-bit parity bit $p_1, \ldots, p_4$ 122 according to the input bit(s) 110. The LDPC code coding apparatus outputs the 20-bit output bit(c) 121 by connecting the 15-bit input bit(s) 110 and the 5-bit parity bit 122. A method for connecting a parity bit to a rear of another input bit is a systematic LDPC code coding method. Therefore, a code rate is $15/20=3/4$. The systematic LDPC code coding method having the input/output configuration is applied to the present invention.

FIG. 2 shows a parity check matrix of an irregular QC-LDPC code in accordance with an embodiment of the present invention.

Referring to FIG. 2, in the parity check matrix of irregular QC-LDPC code, squares 201 and 202 denote a 38×38 identity matrix, i.e., a subblock, and an inner value denotes a cyclic shift value which is cyclic-shifted to the right. For example, the square 201 having a value '30' denotes a subblock cyclic-shifted to the right as much as the value '30'. The square 202 having a value '−' denotes '0 matrix' where all elements are '0'. Therefore, in the parity check matrix of the irregular QC-LDPC code shown in FIG. 2, the 38×38 subblock includes 12 rows and 24 columns. That is, the parity check matrix of the irregular QC-LDPC code includes 456 rows and 912 columns.

The parity check matrix in accordance with the present invention, i.e., the H matrix, has a following characteristic except a case that the cyclic shift value of the subblock is '0 matrix' having the value '−'. The parity part of the parity check matrix in accordance with the present invention has a residue acquired after dividing a row value of a basic parity check matrix by 38 as a cyclic shift value. Also, the systematic part of the parity check matrix has different cyclic shift values in the same column except '0 matrix'. This limit condition is also applied to a parity block 22 or an information block 21. According to the limit condition, coding can be easily performed and a parity check matrix having a fast decoding convergence speed can be acquired.

In the H matrix, residues acquired by dividing the cyclic shift value by 19 as well as the cyclic shift value of the subblock except '0 matrix' corresponding to the same column of the basic parity check matrix are different. This limit condition is useful when the convergence speed of the decoder is accelerated two times while complexity increases two times or when the size of the subblock increases or decreases two times.

In the parity check matrix of FIG. 2, setting up the residue acquired by dividing the row value of the basic parity check matrix by 38 as the cyclic shift value is an example of the method for differentiating the cyclic shift values except '0 matrix' corresponding to the same column of the basic parity check matrix. That is, modification into other formats is possible.

Generally, the H matrix and a coded code word vector c should satisfy Equation 1:

$$H \cdot c^T = 0 \qquad \text{Eq. 1}$$

where H is an H matrix and c is a coded code word vector.

In Equation 1, the code word vector c should determine the connected parity bits 122 among the output vectors of the LDPC code coding apparatus of FIG. 1. For example, in the parity check matrix of FIG. 2, 456 parity bits satisfying Equation 1 where a subblock size (38)×12 bits=456 parity bits are acquired.

In order to describe the coding apparatus of the LDPC code in accordance with the present invention in detail, the parity check matrix of the LDPC code having a small size will be described as an example. Those skilled in the art can easily extend diverse subblock sizes and the code rate.

Figure 3:
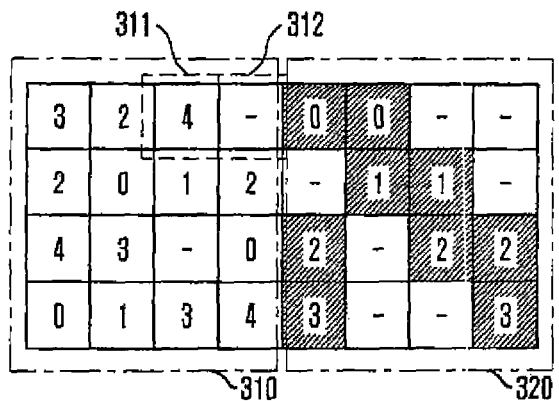
FIG. 3 shows the parity check matrix of the irregular QC-LDPC code in accordance with another embodiment of the present invention.

FIG. 3 shows a parity check matrix of an irregular QC-LDPC code in accordance with an embodiment of the present invention.

Referring to FIG. 3, in the parity check matrix of the irregular QC-LDPC code, squares 311 and 312 denote a 5×5 identity matrix, i.e., a subblock, and an inner value denotes a cyclic shift value which is cyclic-shifted to the right. For example, a square 511 of a value '30' denotes a subblock which is cyclic-shifted to the right as many as '30'. Also, a square 512 of a value '−' denotes '0 matrix' where all elements are '0'. Therefore, in the parity check matrix of the irregular QC-LDPC code shown in FIG. 3, the 5×5 subblock includes 4 rows and 8 columns. That is, the parity check matrix of the irregular QC-LDPC code includes 20 rows and 40 columns.

The parity check matrix shown in FIG. 3 is applied to an LDPC code of a code rate ½ and a code length 40. Therefore, a systematic part 310 includes first 20 columns and a parity part 320 includes last 20 columns. To produce a parity bit satisfying Equation 1, the LDPC code coding apparatus calculates matrix multiplication of the systematic part 310 of the parity check matrix, i.e., information blocks and an input information bit. This procedure can be calculated through diverse methods and corresponds to a front part of Equation 2:

$$H_s \cdot c_s^T + H_p \cdot c_p^T = 0 \quad \text{Eq. 2}$$

where $H_s$ is an information block of a parity check matrix; $c_s$ is an information block of a code word; $H_p$ is a parity block of a parity check matrix; $c_p$ is a parity block of a code word; and $H_s \cdot c_s^T$ is an information vector, i.e., an X vector.

Therefore, the LDPC code coding apparatus has different methods for acquiring a parity block of the LDPC code shown in Equation 2. Generally, the LDPC code coding apparatus acquires the parity block of the LDPC code based on a linear equation for simply acquiring an inverse matrix. However, solving the linear equation for acquiring the inverse matrix causes increase of the length of the code word, thereby increasing complexity by geometric progression.

Figure 4:
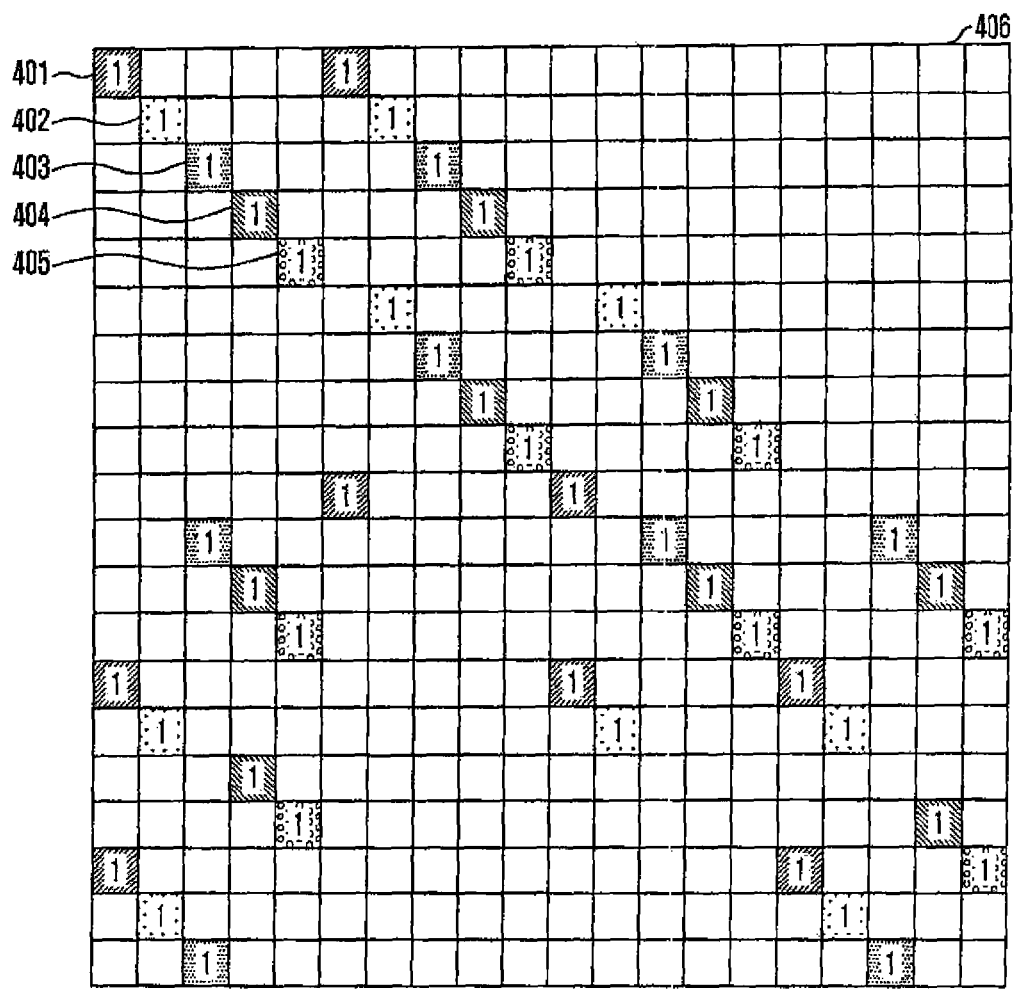
FIG. 4 shows a parity block displaying all subblocks of FIG. 3.

FIG. 4 shows a parity block displaying all subblocks of FIG. 3.

A vacant block 406 shown in FIG. 4 denotes '0' and blocks 401 to 405 of a value '1' are arrayed according to the cyclic shift value of the parity check matrix shown in FIG. 3.

The LDPC code coding apparatus calculates the information block of the parity check matrix and the information vector of the LDPC code, i.e., the X vector $H_s \cdot c_s^T$. Then, Equation 2 becomes a 20×20 linear equation for deriving a $H_p \cdot c_p^T$ part showing the multiplication of the parity block of the parity check matrix and the parity block of the LDPC code.

In the LDPC code coding apparatus in accordance with the present invention, the 20×20 linear equation is divided into 5 independent 4×4 linear equations. The linear equation can be divided since the cyclic shift value of the parity block of the parity check matrix has different cyclic shift values to any one column.

To be specific, in a parity block $H_p$ shown in FIG. 4, a value '1' 401 corresponding to one shading is displayed in the same row and column corresponding to the shading. In other words, values '1' 401 to 405 are arrayed in different rows and columns. For example, there are the values '1' 401 having the same shading in 1st, 6th, 11th and 16th columns having the value '1' 401. The values '1' 402 to 405 having different shadings are arrayed in different columns. This rule is applied to each row in the same way.

The LDPC code coding apparatus can divide the 20×20 linear equation for acquiring the parity block $H_p$ and the parity block $c_p$ of the LDPC code into 5 4×4 linear equations based on the value '1' displayed in each row and column according to shadings. Therefore, the LDPC code coding apparatus divides the 20×20 linear equation into 5 4×4 linear equations and can easily perform coding through linear equation calculation of a small size. Furthermore, the LDPC code coding apparatus can have a fast decoding convergence speed.

The LDPC code coding apparatus inputs a predetermined value, e.g., '0', in a first parity bit, and sequentially acquires $2^{nd}$, $3^{rd}$ and $4^{th}$ parity bits. The LDPC code coding apparatus can perform coding through an exclusive-OR (XOR) operation on $2^{nd}$ and $3^{rd}$ bits as an updated 1st parity bit. When the parity bits are sequentially acquired in FIGS. 3 and 4, the cyclic shift value increases by '1' according to increase of the row. Accordingly, a procedure for cyclic-shifting the multiplication of an information block of a pre-calculated parity check matrix and an information block of a code word on the basis of 5 units which are a subblock size is required.

A procedure of acquiring a parity bit after determining a parity bit in advance can be easily applied to a parity check matrix having a 38×38 unit subblock. The LDPC code coding apparatus can acquire 456 bits which are the multiplication of the information block of the parity check matrix and the information block of the code word according to diverse methods. The LDPC code coding apparatus sequentially updates a $2^{nd}$ parity block to a $12^{th}$ parity block by inputting a predetermined value, e.g., '0', into a $1^{st}$ parity block while cyclic-shifting the acquired value on the basis of 38 units which are a subblock size according to increase of the row block. Subsequently, the LDPC code coding apparatus can easily perform coding into a parallel of 38 units through XOR operation on $2^{nd}$ to $7^{th}$ parity blocks based on the updated $1^{st}$ parity block.

Figure 5:
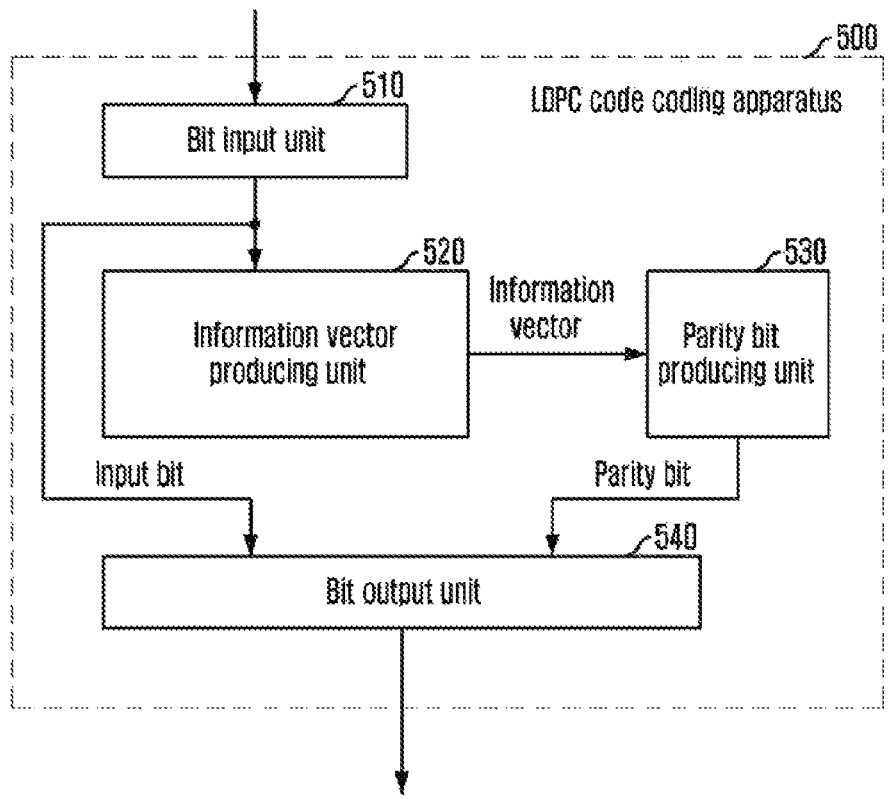
FIG. 5 is a block diagram showing the LDPC code coding apparatus in accordance with an embodiment of the present invention.

FIG. 5 is a block diagram showing the LDPC code coding apparatus in accordance with an embodiment of the present invention.

Referring to FIG. 5, the LDPC code coding apparatus 500 in accordance with the present invention includes a bit input unit 510, an information vector producing unit 520, a parity bit producing unit 530 and a bit output unit 540.

The bit input unit 510 sequentially receives values inputted in the LDPC code coding apparatus 500 and respectively transmits the values to the information vector producing unit 520 and the bit output unit 540 at a predetermined time.

The information vector producing unit 520 stores a parity check matrix, i.e., an H matrix, and produces an information vector, i.e., an X vector, by multiplying an input bit inputted in the bit input unit 510 and an information block of the stored parity check matrix.

The parity bit producing unit 530 derives a linear equation by applying the information vector produced in the information vector producing unit 520 and the parity block of the parity check matrix to Equation 2. The parity bit producing unit 530 produces a parity bit by dividing the linear equation into independent linear equations of a small size. The parity bit producing unit 530 designates a parity bit in advance and produces a parity bit by inversely applying the pre-designated parity bit to the divided independent linear equation. To solve the linear equation, the parity bit producing unit 530 divides the information vector on the basis of size unit of the subblock and sequentially performs cyclic-shifting according to increase of the row block. The parity bit producing unit 530 performs a parallel process on the divided independent linear equation on the basis of subblock unit.

Figure 6:
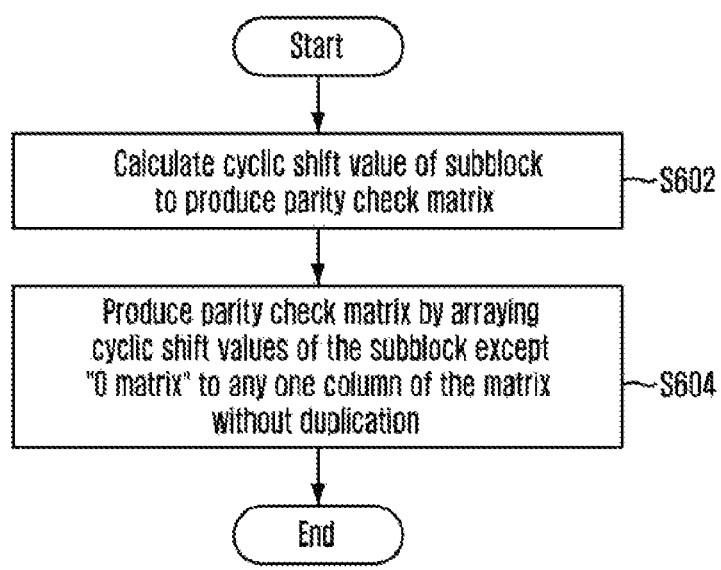
FIG. 6 is a flowchart describing a parity check matrix producing method for low complexity and high-speed decoding in accordance with an embodiment of the present invention.

The parity check matrix is the check matrix produced in the procedure of FIG. 6. The cyclic shift values of the subblock except '0 matrix' are arrayed without duplication to any one column.

The bit output unit 540 produces a code word by combining the input bit inputted in the bit input unit 510 and the parity bit produced in the parity bit producing unit 530. The bit output unit 540 sequentially outputs the produced code word at a predetermined time.

FIG. 6 is a flowchart describing a parity check matrix producing method for low complexity and high-speed decoding in accordance with an embodiment of the present invention.

The LDPC code coding apparatus 500 calculates a cyclic shift value of a subblock to the parity check matrix to be produced at step S602.

The LDPC code coding apparatus 500 arrays the calculated cyclic shift values of the subblock in the parity check matrix to be produced at step S604. The cyclic shift values of the subblock except '0 matrix' to any one column of the matrix are not duplicated. The LDPC code coding apparatus 500 arrays the same cyclic shift values of the subblock except '0 matrix' to any one row in the parity block of the produced parity check matrix.

The LDPC code coding apparatus 500 arrays the same cyclic shift values of the subblock when the arrayed cyclic shift value of the subblock in the parity block of the parity check matrix is determined as a residue value acquired after dividing the row value of the parity check matrix by a size value of the subblock.

Referring to FIG. 2, the parity block of the parity check matrix includes a cyclic shift value of a subblock of a duel-diagonal format. Referring to FIG. 4, the parity block of the parity check matrix includes element sets corresponding to the same row and columns and the element sets are differentiated from each row and column.

Figure 7:
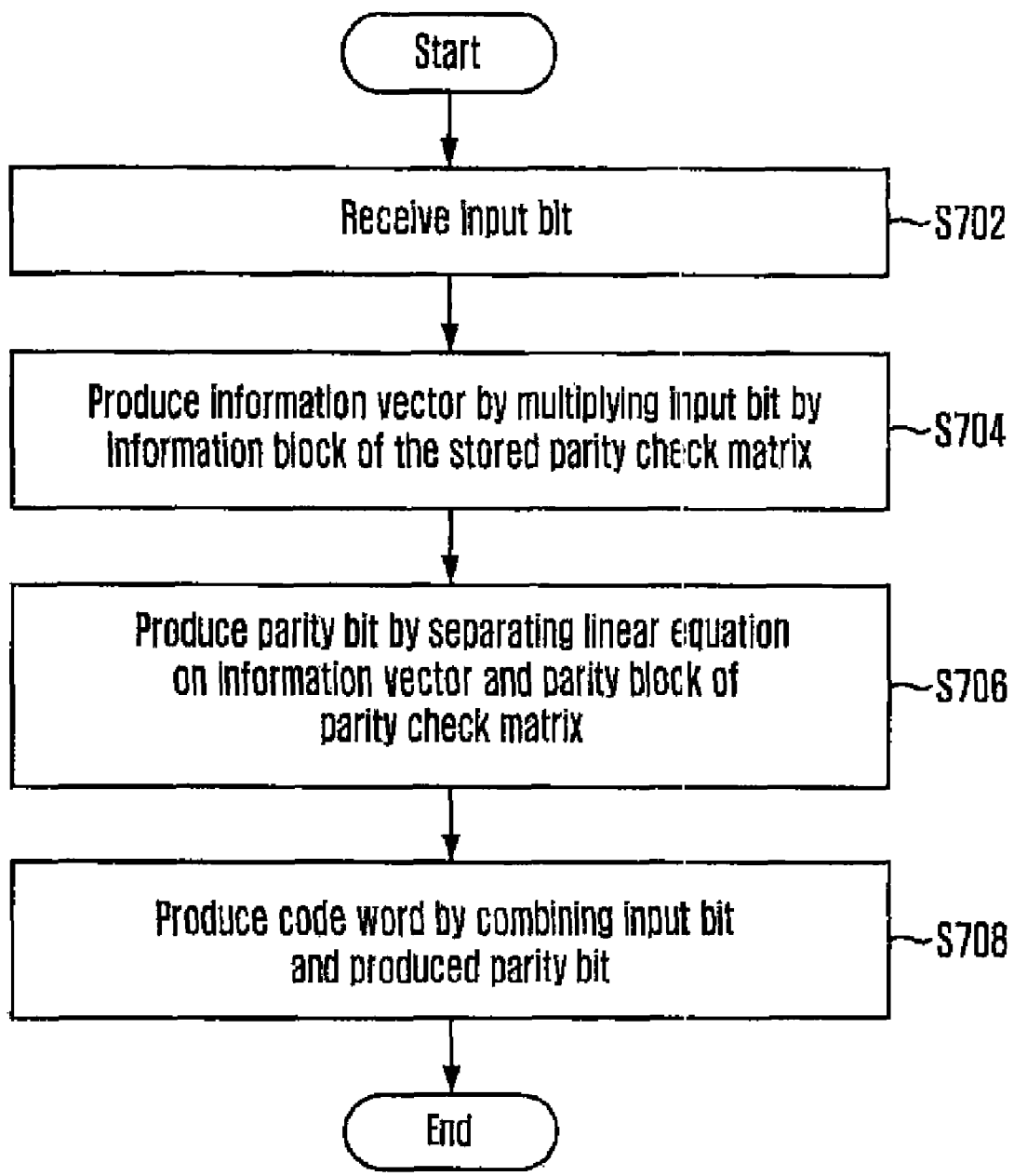
FIG. 7 is a flowchart describing an LDPC code coding method in accordance with an embodiment of the present invention.

FIG. 7 is a flowchart describing an LDPC code coding method in accordance with an embodiment of the present invention.

The bit input unit 510 sequentially receives a value inputted in the LDPC code coding apparatus 500 at step S702.

The information vector producing unit 520 produces an information vector, i.e., an X vector, by multiplying an input bit inputted in the bit input unit 510 by an information block of the stored parity check matrix at step S704.

The parity bit producing unit 530 derives a linear equation by applying the information vector produced in the information vector producing unit 520 and the parity block of the parity check matrix to Equation 2 and produces a parity bit at step S706 by separating the linear equation as an independent linear equation and dividing the linear equation into linear equations of a small size.

The parity bit producing unit 530 produces a parity bit by designating a parity bit in advance and inversely applying the pre-designated parity bit to the separated independent linear equation. To solve the linear equation, the parity bit producing unit 530 divides the information vector on the basis of subblock size unit and sequentially performs cyclic-shifting according to increase of the row block. The parity bit producing unit 530 performs a parallel process on the separated independent linear equation on the basis of subblock unit.

The parity check matrix is the check matrix produced in the procedure of FIG. 6. The cyclic shift values of the subblock except '0 matrix' are arrayed without duplication to any one column.

The bit output unit 540 produces a code word at step S708 by combining the input bit inputted in the bit input unit 510 and the parity bit produced in the parity bit producing unit 530.

As described above, the technology of the present invention can be realized as a program. A code and a code segment forming the program can be easily inferred from a computer programmer of the related field. Also, the realized program is stored in a computer-readable recording medium, i.e., information storing media, and is read and operated by the computer, thereby realizing the method of the present invention. The recording medium includes all types of recording media which can be read by the computer.

The present invention can reduce complexity and decode a parity check code at high-speed by producing a parity check matrix by arraying shift values of a subblock of the parity check matrix without duplication, and producing a parity bit by classifying a linear equation on the produced parity check matrix as an independent linear equation.

Also, the present invention can reduce complexity of hardware more easily than the conventional coding method and be easily applied to a QC-LDPC coding-based parallel process for high-speed decoding.

The present invention can maximally use hardware resources by realizing a new decoding apparatus by modifying a conventional decoding apparatus.

While the present invention has been described with respect to the specific embodiments, it will be apparent to those skilled in the art that various changes and modifications may be made without departing from the spirit and scope of the invention as defined in the following claims.

What is claimed is:

1. A method for producing a parity check matrix for coding Low Density Parity Check (LDPC) code, comprising:
    calculating, by an LDPC code coding apparatus, cyclic shift values of a subblock with respect to a matrix; and
    when the calculated cyclic shift values of the subblock are arrayed in the matrix, producing, from the LDPC code coding apparatus, a parity check matrix by arraying the cyclic shift values of the subblock except '0 matrix' without duplication to any one column.

2. The method of claim 1, wherein the same cyclic shift values of the subblock except '0 matrix' to any one row in a parity block of the produced parity check matrix are arrayed.

3. The method of claim 2, wherein the arrayed cyclic shift values of the subblock in the parity block of the produced parity check matrix is determined as a residue value acquired after dividing a row value of the parity check matrix by a size value of the subblock.

4. The method of claim 3, wherein the parity block of the parity check matrix includes a cyclic shift value of a subblock of a duel-diagonal format.

5. The method of claim 3, wherein the parity block of the parity check matrix includes element sets corresponding to the same row and column and the included element sets are differentiated to each row and column.

6. An apparatus for coding a Low Density Parity Check (LDPC) code for low complexity and high-speed decoding, comprising:
    a bit input unit for receiving an input bit;

an information vector producing unit for producing an information vector by multiplying the received input bit by an information block of a parity check matrix for high-speed decoding;

a parity bit producing unit for producing a parity bit by separating the produced information vector and a linear equation on a parity block of the parity check matrix as an independent linear equation; and a bit output unit for outputting a code word by combining the received input bit and the produced parity bit.

7. The apparatus of claim 6, wherein in the parity check matrix for high-speed decoding, cyclic shift values of a sub-block except '0 matrix' are arrayed without duplication to any one column.

8. The apparatus of claim 7, wherein the parity bit producing unit produces a parity bit by designating a parity bit in advance and inversely applying a pre-determined parity bit to a separated independent linear equation.

9. The apparatus of claim 8, wherein the parity bit producing unit divides the produced information vector on the basis of a subblock size unit and sequentially performs cyclic-shifting according to increase of a row block.

10. The apparatus of claim 9, wherein the parity bit producing unit performs a parallel process on the separated independent linear equation on the basis of subblock unit.

11. A method for coding Low Density Parity Check (LDPC) code for low complexity and high-speed decoding, comprising:

receiving, by an LDPC code coding apparatus, an input bit;

producing, in the LDPC code coding apparatus, an information vector by multiplying the received input bit by an information block of a parity check matrix for high-speed decoding;

producing, in the LDPC code coding apparatus, a parity bit by separating the produced information vector and a linear equation on a parity block of the parity check matrix as an independent linear equation; and outputting, from the LDPC code coding apparatus, a code word by combining the received input bit and the produced parity bit.

12. The method of claim 11, wherein in the parity check matrix for high-speed decoding, cyclic shift values of a sub-block except '0 matrix' are arrayed without duplication to any one column.

13. The method of claim 12, wherein the parity bit is produced by designating the parity bit in advance and inversely applying a pre-determined parity bit to a separated independent linear equation.

14. The method of claim 13, wherein the produced information vector is divided on the basis of a subblock size unit and sequentially cyclic-shifted according to increase of a row block.

15. The method of claim 14, wherein a parallel process is performed on the separated independent linear equation.

* * * * *